United States Patent
Brunner et al.

(10) Patent No.: US 7,825,574 B2
(45) Date of Patent: Nov. 2, 2010

(54) HIGH-EFFICIENCY LED-BASED ILLUMINATION SYSTEM WITH IMPROVED COLOR RENDERING

(75) Inventors: Herbert Brunner, Sinzing (DE); Tim Fiedler, München (DE); Frank Jermann, München (DE); Martin Zachau, Geltendorf (DE)

(73) Assignees: OSRAM Gesellschaft mit beschränkter Haftung, München (DE); Osram Opto Semiconductors GmbH, Regensburg (DE)

( * ) Notice: Subject to any disclaimer, the term of this patent is extended or adjusted under 35 U.S.C. 154(b) by 1017 days.

(21) Appl. No.: 10/574,021

(22) PCT Filed: Sep. 24, 2004

(86) PCT No.: PCT/DE2004/002135

§ 371 (c)(1),
(2), (4) Date: Mar. 23, 2006

(87) PCT Pub. No.: WO2005/030903

PCT Pub. Date: Apr. 7, 2005

(65) Prior Publication Data
US 2007/0069643 A1 Mar. 29, 2007

(30) Foreign Application Priority Data
Sep. 24, 2003 (DE) ................. 103 44 332

(51) Int. Cl.
H01J 1/62 (2006.01)
H01J 63/04 (2006.01)
(52) U.S. Cl. .................. 313/498; 313/483; 313/512; 313/485; 313/486; 313/500; 313/503; 313/504; 313/505; 313/506; 257/98
(58) Field of Classification Search ............ None
See application file for complete search history.

(56) References Cited

U.S. PATENT DOCUMENTS 4,897,319 A  1/1990  Sun (Continued)

FOREIGN PATENT DOCUMENTS

DE  101 53 615 C1  7/2003

(Continued)

OTHER PUBLICATIONS

J. van Krevel, "On new rare-earth doped M-Si-Al-O-N materials", Chapter 6, pp. 73-87, 2000.

*Primary Examiner*—Nimeshkumar D Patel
*Assistant Examiner*—Natalie K Walford
(74) *Attorney, Agent, or Firm*—Cohen Pontani Lieberman & Pavane LLP

(57) ABSTRACT

The illumination system makes simultaneous use of the color-mixing principle from blue, green and red (RGB mixing) and the principle of converting of a primary radiation emitted by an LED into light with a longer wavelength by a phosphor which absorbs this radiation, with at least two LEDs being used, of which a first LED emits primarily in the range from 340 to 470 nm (dominant wavelength) and a second LED emits in the red region at 600 to 700 nm (dominant wavelength), wherein the green component is produced by the primary radiation of the first LED being at least partially converted by a green-emitting phosphor, the green-emitting phosphor used being a phosphor from the class of the oxynitridosilicates, having a cation M and the empirical formula $M_{(1-c)}Si_2O_2N_2:D_c$, M comprising Sr as a constituent and D being doped with divalent europium, where M=Sr or M= $Sr_{(1-x-y)}Ba_yCa_x$ with x+y<0.5 is used, the oxynitridosilicate completely or predominantly comprising the high-temperature-stable modification HT.

27 Claims, 4 Drawing Sheets

U.S. PATENT DOCUMENTS

| | | | |
|---|---|---|---|
| 6,158,882 A | 12/2000 | Bischoff, Jr. | |
| 6,255,670 B1 | 7/2001 | Srivastava et al. | |
| 6,539,656 B2 * | 4/2003 | Maas et al. | 40/546 |
| 6,632,379 B2 * | 10/2003 | Mitomo et al. | 252/301.4 R |
| 6,649,946 B2 * | 11/2003 | Bogner et al. | 257/233 |
| 6,692,136 B2 * | 2/2004 | Marshall et al. | 362/231 |
| 6,717,353 B1 | 4/2004 | Mueller et al. | |
| 7,061,024 B2 | 6/2006 | Schmidt et al. | |
| 7,351,356 B2 * | 4/2008 | Delsing et al. | 252/301.4 S |
| 2002/0003233 A1 | 1/2002 | Mueller-Mach et al. | |
| 2002/0043926 A1 | 4/2002 | Takahashi et al. | |
| 2002/0105269 A1 | 8/2002 | Ellens et al. | |
| 2003/0094893 A1 | 5/2003 | Ellens et al. | |
| 2004/0135504 A1 | 7/2004 | Tamaki et al. | |
| 2005/0205845 A1 | 9/2005 | Delsing et al. | |
| 2006/0244000 A1 | 11/2006 | Jäger et al. | |

FOREIGN PATENT DOCUMENTS

| | | |
|---|---|---|
| DE | 102 03 795 A1 | 8/2003 |
| EP | 1 104 799 A | 6/2001 |
| EP | 1 264 873 A | 12/2002 |
| EP | 1 296 376 | 3/2003 |
| EP | 1 413 618 A | 4/2004 |
| WO | WO 97/48138 | 12/1997 |
| WO | WO 00/19141 | 4/2000 |
| WO | WO 01 24229 A2 | 4/2001 |
| WO | WO 01/40403 A | 6/2001 |
| WO | WO 01/41215 A1 | 6/2001 |
| WO | WO 01/50540 A1 | 7/2001 |
| WO | WO 02/052901 A2 | 7/2002 |
| WO | WO 02/052902 A2 | 7/2002 |
| WO | WO 2004/030109 A | 4/2004 |
| WO | WO 2004/036962 | 4/2004 |
| WO | WO 2004030109 A1 * | 4/2004 |

* cited by examiner

HIGH-EFFICIENCY LED-BASED ILLUMINATION SYSTEM WITH IMPROVED COLOR RENDERING

RELATED APPLICATION

This is a U.S. national stage of application No. PCT/DE2004/002135, filed on 24 Sep. 2004.

The present application is closely related to the following applications:

Ser. Nos. 10/572,891, 10/574,026, and 10/574,021

FIELD OF THE INVENTION

The invention is based on a high-efficiency LED-based illumination system with improved color rendering. It deals in particular with luminescence conversion LEDs which in particular are completely tunable.

BACKGROUND OF THE BACKGROUND

One concept for a high-efficiency LED-based illumination system with improved color rendering is three-color mixing. In this concept, the mixture of the primary colors red-green-blue (RGB) is used to generate white. A blue LED can be used for partial conversion of two phosphors which emit red and green. The search for an efficient green phosphor for an RGB system is currently at the forefront of research, as is demonstrated, for example, by the proposal from U.S. Pat. No. 6,255,670. Alternatively, a UV-emitting LED which excites three phosphors respectively emitting in the red, green and blue is used, cf. WO 97/48138. Examples include line emitters, such as YOB:Ce, Tb (green) and YOS:Eu (red). This requires a relatively short-wave emission (UV region <370 nm) to enable high quantum efficiencies to be achieved. This requires the use of sapphire substrates for the UV-LED, which are very expensive. On the other hand, if a UV-LED based on the less expensive SiC substrates is used, one has to be satisfied with an emission in the range from 380 to 420 nm. The individual colors of the RGB system can in principle be generated by the primary radiation of LEDs or by luminescence conversion LEDs, as is illustrated by WO 01/41215.

To increase the overall light yield, a complicated system including a fourth LED which emits in the range from 575 to 605 nm has also been proposed in WO 00/19141. By its very nature, a system of this type is significantly more intricate, expensive and complicated than an RGB system.

DE-1 A 101 37 042 shows a slightly different concept, proposing a planar illumination system with special introduction of the blue component in order to avoid the usual absorption problems encountered with blue phosphors.

One interesting class of phosphors for illumination systems of this type are those of the oxynitridosilicate type, as are known per se under the shortened formula MSiON; cf. for example "On new rare-earth doped M-Si—Al—O—N materials", J. van Krevel, TU Eindhoven 2000, ISBN 90-386-2711-4, Chapter 6. They are doped with Tb. Emission is achieved under excitation by 365 nm or 254 nm.

A new type of phosphor is known from the as yet unpublished EP patent application 02 021 117.8. It consists of Eu- or Eu,Mn-coactivated oxynitridosilicate of formula $MSi_2O_2N_2$ (M=Ca, Sr, Ba).

SUMMARY OF THE INVENTION

It is an object of the present invention to provide an LED-based illumination system with improved color rendering A further object is to provide a tunable illumination system.

These and other objects are attained in accordance with one aspect of the present invention directed to a high-efficiency LED-based illumination system with improved color rendering, simultaneously exploiting the color-mixing principle of blue, green and red (RGB mixing) and the principle of converting a primary radiation emitted by an LED into light with a longer wavelength by means of a phosphor which at least partially absorbs this radiation, at least two LEDs being used, of which a first LED emits primarily in the range from 340 nm to 470 nm (peak wavelength), in particular at least 420 nm, and a second LED emits in the red region at 600 to 700 nm (peak wavelength), wherein the green component is produced by the primary radiation of the first LED being at least partially converted by a green-emitting phosphor, the green-emitting phosphor used being a phosphor from the class of the oxynitridosilicates, having a cation M and the empirical formula $M_{(1-c)}Si_2O_2N_2{:}D_c$, where M comprises Sr as a constituent and M=Sr alone or $M=Sr_{(1-x-y)}Ba_yCa_x$ with $0 \leq x+y < 0.5$ being used, and the oxynitridosilicate completely or predominantly comprising the high-temperature-stable modification HT.

The use of RGB-LEDs, which comprise three chips with the emission colors RGB, is of interest for certain applications. Since all three colors are realized by different LEDs, it is possible for all three components to be actuated independently of one another. Therefore, with this type of illumination system it is possible to deliberately set virtually any desired color locus by means of corresponding control electronics. One drawback of this solution is a very low color rendering index Ra<50, which results from the narrow-band nature of the three individual emissions. A further drawback is that the green LED used, for technological reasons, is significantly less efficient than the other two components. An additional factor is that the color locus is highly dependent on the operating current and the temperature. Current technology (InGaN LED for blue 430 to 470 nm and InGaAlP LED for yellow >540 nm, in particular red in the range from 600 to 700 nm) has not provided a convincing solution for the primary radiation of an LED to be in the green spectral region. However, the advantage of the RGB solution realized using primary radiation is that illumination systems of this type are tunable.

On the other hand, for illumination systems in which high demands on the color rendering are to the fore, LEDs in which some of the primary LED emission is converted into light with a longer wavelength, in particular green, are used. However, such a structure is not tunable, since the secondary component is not independent of the primary component.

Hitherto, there has not been a high-efficiency green-emitting phosphor which is at the same time insensitive to external influences.

The illumination system according to an embodiment of the invention makes use of the green-emitting phosphor from the class of the oxynitridosilicates, having a cation M and the empirical formula $M_{(1-c)}Si_2O_2N_2{:}D_c$, M comprising Sr as a constituent and D being doped with divalent europium, with M=Sr, or $M=Sr_{(1-x-y)}Ba_yCa_x$ with $x+y<0.5$ being used, the oxynitridosilicate completely or predominantly comprising the high-temperature-stable modification HT.

An embodiment of the invention uses a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor. This HT modification is distinguished by the fact that it can be excited within a broad band, that it is extremely stable with respect to external influences, i.e. does not reveal any measurable degradation at 150° C., and that it has an extremely good color locus stability under fluctuating conditions (little drift detectable between 20 and 100° C.). Further plus points include its low absorption in the red, which is particularly advantageous in the case of phosphor mixtures. This phosphor is often also referred to below as Sr Sion:Eu.

When producing the novel phosphor, it is important in particular to use a high temperature, the synthesis range lying between 1300 and 1600° C. Another determining factor is the reactivity of the starting components, which should be as high as possible.

The phosphor $MSi_2O_2N_2$:Eu (M=Ca, Sr, Ba) which is known from EP patent application 02 021 117.8, in the case of the Sr-dominated embodiment with M=Sr or M=$Sr_{(1-x-y)}Ba_yCa_x$ with x+y<0.5, referred to below as Sr Sion, is difficult to control. Although some test conditions give excellent results, there has hitherto been no guiding principle as to how to obtain desired results in a reliable way. An additional factor is a certain tendency of the efficiency of the phosphor to be reduced and the color locus to vary excessively under high thermal loads.

Surprisingly, it has now been found that the two phases fundamentally differ in terms of their suitability for use as a phosphor. Whereas the LT phase is of only limited use as an Eu-doped phosphor and tends to emit orange-red light, the HT phase has an excellent suitability for use as a phosphor which emits green light. There is often a mixture of the two modifications which manifests both forms of emission over a broad band. It is therefore desirable for the HT phase to be produced in as pure a form as possible, in a proportion of at least 50%, preferably at least 70%, particularly preferably at least 85%.

This requires an annealing process which is carried out at at least 1300° C. but no more than 1600° C. A temperature range from approximately 1450 to 1580° C. is preferred, since LT phase is formed to an increasing extent at lower temperatures and the phosphor becomes increasingly difficult to process at higher temperatures; above approximately 1600° C. it forms a hard-sintered ceramic or melt. The optimum temperature range depends on the precise composition and the properties of the starting materials.

A batch of the starting products which is substantially stoichiometric using the base components $SiO_2$, $SrCO_3$ and $Si_3N_4$ is particularly important for producing an efficient phosphor of the Sr Sion type. Sr acts as a representative example of M in this context. The deviation should amount to no more than in particular 10%, preferably 5%, from the ideal stoichiometric batch, including any addition of a melting auxiliary, as is often customary. A maximum deviation of 1% is particularly preferred. In addition, there is a precursor for the europium fraction of the doping, realized, for example, as oxide $Eu_2O_3$. This discovery runs contrary to the previous procedure of adding the base component $SiO_2$ in a significantly substoichiometric proportion. This discovery is also particularly surprising on account of the fact that other Sions which are recommended for use as phosphors, such as Ba Sion in accordance with the teaching of EP patent application 02 021 117.8, should indeed be produced with a substoichiometric quantity of $SiO_2$.

Therefore, a corresponding batch for the Sr Sion $MSi_2O_2N_2$ uses 11 to 13% by weight of $SiO_2$, 27 to 29% by weight of $Si_3N_4$, remainder $SrCO_3$. Ba and Ca fractions in M are correspondingly added as carbonates. Europium is added, in accordance with the desired doping, for example as an oxide or fluoride, as a replacement for $SrCO_3$. The batch $MSi_2O_2N_2$ is also to be understood as encompassing any deviations from the exact stoichiometry, provided that they are compensated for with a view to charge retention.

It has proven particularly expedient for the starting components of the host lattice, in particular $Si_3N_4$, to have the highest possible purity. Therefore, $Si_3N_4$ which is synthesized from the liquid phase, for example starting from silicon tetrachloride, is particularly preferred. In particular the contamination with tungsten and cobalt has proven critical. The impurity levels of each of these constituents should be as low as possible, and in particular should in each case be less than 100 ppm, in particular less than 50 ppm, based on these precursor substances. Furthermore, the highest possible reactivity is advantageous; this parameter can be quantified by the reactive surface area (BET), which should be at least 6 $m^2$/g, advantageously at least 8 $m^2$/g. The level of contamination with aluminum and calcium, based on this precursor substance $Si_3N_4$, should as far as possible also be below 100 ppm.

In the event of a deviation from the above procedure with regard to a stoichiometric batch and temperature management, increasing levels of undesirable foreign phases, namely nitridosilicates $M_xSi_yN_z$, such as for example $M_2Si_5N_8$, are formed if the addition of $SiO_2$ is set at too low a level, so that an excess of nitrogen is produced. Although this compound per se is a useful phosphor, with regard to the synthesis of the Sr Sion, it is extremely disruptive just like other nitridosilicates, since these foreign phases absorb the green radiation of the Sr Sion and may convert it into the known red radiation provided by the nitridosilicates. Conversely, if too much $SiO_2$ is added, Sr silicates, such as for example $Sr_2SiO_4$, are formed, since an excess of oxygen is produced. Both foreign phases absorb the useful green emission or at least lead to lattice defects such as vacancies, which have a considerable adverse effect on the efficiency of the phosphor. The starting point used is the basic principle that the level of the foreign phases should be as far as possible below 15%, preferably even below 5%. In the XRD spectrum of the synthesized phosphor, this corresponds to the requirement that with the XRD diffraction angle 2 Θ in the range from 25 to 32°, the intensity of all the foreign phase peaks should be less than ⅓, preferably less than ¼, particularly preferably less than ⅕, of the intensity of the main peak characterizing the HT modification at approximately 31.8°. This applies in particular to the foreign phases of type $Sr_xSi_yN_z$, in particular $Sr_2Si_5N_8$.

With an optimized procedure, it is reliably possible to achieve a quantum efficiency of from 80 to well over 90%. By contrast, if the procedure is not specific, the efficiency will typically lie in the range from at most 50 to 60% quantum efficiency.

Therefore, according to the invention it is possible to produce a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor, preferably more than 85% of the phosphor. This HT modification is distinguished by the fact that it can be excited within a broad band, namely in a wide range from 50 to 480 nm, in particular 150 to 480 nm, particularly preferably from 250 to 470 nm, that it is extremely stable with respect to external influences, i.e. does not reveal any measurable degradation at 150° C. in air, and that it has an extremely good color locus stability under fluctuating conditions. Further plus points include its low absorption in the red, which is particularly advantageous in the case of phosphor mixtures. This phosphor is often also referred to below as Sr Sion:Eu. A majority of the HT modification can be recognized, inter alia, from the fact that the characterizing peak of the LT modification in the XRD spectrum at approximately 28.2° has an intensity of less than 1:1, preferably less than 1:2, compared to the peak with the highest intensity from the group of three reflections of the HT modification which lie in the XRD spectrum at 25 to 27°. The XRD spectra cited here in each case relate to excitation by the known Cu—K$_\alpha$ line.

With the same activator concentration, this phosphor reveals different emission characteristics than the LT variant of the same stoichiometry. The full width at half maximum of the HT variant is significantly lower in the case of the optimized HT variant than in the case of the simple mixture containing foreign phases and defects, and is in the range from 70 to 80 nm, whereas the simple mixture containing foreign phases and defects has a full width at half maximum of approximately 110 to 120 nm. The dominant wavelength is generally shorter, typically 10 to 20 nm shorter, in the case of the HT modification than in the case of a specimen containing significant levels of foreign phases. An additional factor is that the efficiency of the high-purity HT modification is typically at least 20% higher, and in some cases significantly higher still, than in the case of the LT-dominated mixture or the mixture with a high level of foreign phases.

One characterizing feature of a sufficiently low level of the NT modification and foreign phases is a full width at half maximum (FWHM) of the emission of less than 90 nm, since the lower the level of foreign phases, the lower the proportion of the specific orange-red emission from the modification which is rich in foreign phases, in particular the nitridosilicate foreign phases Sr—Si—N—Eu such as in particular Sr2Si5N8:Eu.

The abovementioned typical reflections in the XRD spectrum, which reveal the different crystal structure, are another important factor, in addition to the reduced full width at half maximum, in establishing the characterization.

The dominant peak in the XRD spectrum of the HT modification is the peak at approximately 31.7°. Other prominent peaks are the three peaks of approximately the same intensity between 25 and 27° (25.3 and 26.0 and 26.3°), with the peak with the lowest diffraction being the most intensive. A further intensive peak is 12.6°.

This phosphor emits predominantly green light with a dominant wavelength in the range from 550 to 570 nm, in particular 555 to 565 nm.

It is also possible to add a small amount of the AlO group as a replacement for the SiN group in the molecule of the oxynitridosilicate of formula $MSi_2O_2N_2$, in particular in an amount of up to at most 30% of the SiN content.

Both phases of the Sr Sion:Eu can crystallize analogously to the two structurally different host lattice modifications and can each be produced using the SrSi2O2N2:Eu batch stoichiometry. Minor deviations from this stoichiometry are possible. The Eu-doped host lattices surprisingly both luminesce when excited in the blue or UV region, but in each case after host lattice modification with a different emission color. The LT modification reveals an orange emission, the HT modification a green emission at approximately $\lambda_{dom}$=560 nm with in principle a significantly higher efficiency. A desired property of the phosphor can be set accurately as a function of the dopant content and dopant material (Eu or Eu, Mn) and the relative proportions of the HT and LT modifications.

One benefit of the HT phase is the fact that it can be excited with a good level of uniformity over a very wide spectral region with only minor variations in the quantum efficiency.

Moreover, within a wide temperature range the luminescence of the HT modification is only weakly dependent on the temperature. Therefore, the invention has for the first time discovered a green-emitting phosphor, preferably for LED applications, which makes do without special measures to stabilize it. This distinguishes it in particular from the phosphors which have previously been regarded as the most promising candidates for this purpose, namely thiogallate phosphors or chlorosilicates.

The Sion compounds with M=(Sr,Ba), preferably without Ba or with up to 10% of Ba, represent efficient phosphors with a wide range of emission maxima. These maxima are generally at a shorter wavelength than in the case of pure Sr Sion, preferably between 520 and 565 nm. Moreover, the color space which can be achieved can be widened by adding small amounts (preferably up to 30 mol %) of Ca and/or zinc; this shifts the emission maxima toward the longer-wave region compared to pure Sr Sion, and by partially (up to 25 mol %) replacing Si with Ge and/or Sn.

A further embodiment is for M, in particular Sr, to be partially substituted by trivalent or monovalent ions, such as Y3+, La3+ or Li+, Na+. It is preferable for these ions to form at most 20 mol % of the M.

This phosphor has advantages in particular when used in an illumination system, in which case it acts as a green phosphor replacing previous inefficient solutions for the green component. The phosphor is excited either by a blue LED with high-efficiency primary radiation or by a UV-LED. Since the green emission is in a relatively broad band compared to other technological solutions, such as thiogallates or chlorosilicates, a significantly increased color rendering index is established.

This phosphor is particularly well suited to applications in luminescence conversion LEDs which are suitable for full color and luminescence conversion LEDs with colors which can be set as desired based on an LED which primarily emits UV-blue. The conversion by the phosphor according to the invention gives blue-green to green-yellowish colors.

The mixed compounds with M=(Sr,Ba) represent efficient phosphors with a wide range of emission maxima. These maxima are between 520 and 570 nm. Moreover, the color space which can be achieved can be widened by adding small amounts (preferably up to 30 mol %) of Ca and/or zinc and by partially (up to 25 mol %) replacing Si with Ge and/or Sn.

A further embodiment is for M, in particular Sr, to be partially substituted by trivalent or monovalent ions, such as La3+ or Li+. It is preferable for these ions to form at most 20 mol % of the M.

The phosphor according to the invention can preferably be used for luminescence conversion LEDs to generate white light, albeit with blue primary radiation, but also with UV primary radiation, in which case white light is generated by means of phosphors which emit blue and yellow-green. Candidates for the blue component are known per se; by way of example, $BaMgAl_{10}O_{17}:Eu^{2+}$ (known as BAM) or $Ba_5SiO_4(Cl,Br)_6:Eu^{2+}$ or $CaLa_2S_4:Ce^{3+}$ or also $(Sr,Ba,Ca)_5(PO_4)_3Cl:Eu^{2+}$ (known as SCAP) are suitable. The phosphor according to the invention is suitable as the yellow-green component.

A red phosphor is additionally used to improve the color of this system. It is preferable to employ an additional LED which primarily emits red. It is used in particular together with a blue-emitting base LED, and $(Y,La,Gd,Lu)_2O_2S:Eu^{3+}$, $SrS:Eu^{2+}$ or also $(Ca,Sr)_2Si_5N_8:Eu^{2+}$, in particular with a high Ca content, are particularly suitable.

It is in this way possible to achieve color rendering index Ra values of from 85 to 95, in particular in wide ranges with warm-white luminous colors corresponding to a color temperature from 2200 to 3500 K, without adversely affecting the dimmability of the illumination system.

The solution which has been discovered is therefore now superior to both sub-aspect solutions, since it allows a higher efficiency than the previous efficiency-optimized system to be achieved and also offers a much better solution to the dimmable system. The overall result is a breakthrough in this technology.

Particular preference is given to an illumination system in RGB technology which uses only nitride-based phosphors by using a high-efficiency blue LED with a dominant wavelength from 440 to 465 nm, preferably with a peak wavelength of 460 nm, together with luminescence conversion LEDs. A first luminescence conversion LED uses a blue LED, preferably with a peak wavelength of 460 nm, as primary light source, with conversion by means of the above-described Sr Sion as green secondary light source. A second luminescence conversion LED uses a blue LED, preferably with a peak wavelength of approximately 460 nm, as primary light source, with conversion by means of a nitridosilicate of type $(Ca,Sr)_2Si_5N_8:Eu^{2+}$ as red secondary light source. Surprisingly, these three components virtually ideally complement one another in their spectrum, thereby allowing a high color rendering at high efficiency.

The technical realization of the illumination system according to the invention can be implemented in various ways. In particular, what are known as multichip LEDs are of interest, in which the various chips are located inside a housing. There are generally two or three chips. In principle, the following implementations are possible:

In a first embodiment, the first LED is a UV-LED with primary emission in the range from 340 to 430 nm, which excites the green phosphor to secondary emission. The second LED is the red-emitting LED. In addition, a third LED is used, which preferably itself emits primarily in the blue (430 to 470 nm peak) or also in which a blue phosphor is excited by an LED which emits primarily UV.

In a second embodiment, just two LEDs are used. In this case, the first LED either emits primarily UV in the range from 340 to 420 nm, in which case a blue-emitting phosphor and the novel green-emitting phosphor are arranged ahead of it. These two phosphors convert the UV radiation of the first LED completely. However, it is preferable to use an embodiment in which the first LED is a blue-emitting LED with a peak in the range from 430 to 470 nm, which is assigned a novel green-emitting phosphor which partially converts the primary light of the LED into green secondary radiation. The second LED is once again the red-emitting LED. Of course, the possibility of the red component also being generated by conversion of a radiation with a shorter wavelength, for example from a UV-LED or blue LED, is not ruled out.

Naturally, the LEDs described here may also be understood as encompassing groups of LEDs of the same type.

The individual chips are in this case locally provided with the respective phosphor. For this purpose, the individual chips may be located in different hollows or cavities or together in a single cavity. The chips have in this case normally already been provided with the phosphor in a prior process. In the case of the solution with a single cavity or a solution in which the phosphor is arranged so as to be physically separate from the chip, it is also possible for the phosphor to be applied only after the chips have been installed in the housing of the illumination system. The phosphors described are particularly suitable for technologies using near-chip conversion, as are known per se from the literature, cf. for example DE 102 03 795.

Furthermore, the invention relates to an illumination system having LEDs as described above, the illumination system also including electronic components which, by way of example, impart dimmability. A further purpose of the electronics is to actuate individual LEDs or groups of LEDs. These functions may be realized by known electronic components.

DETAILED DESCRIPTION OF THE DRAWINGS

Figure 1:
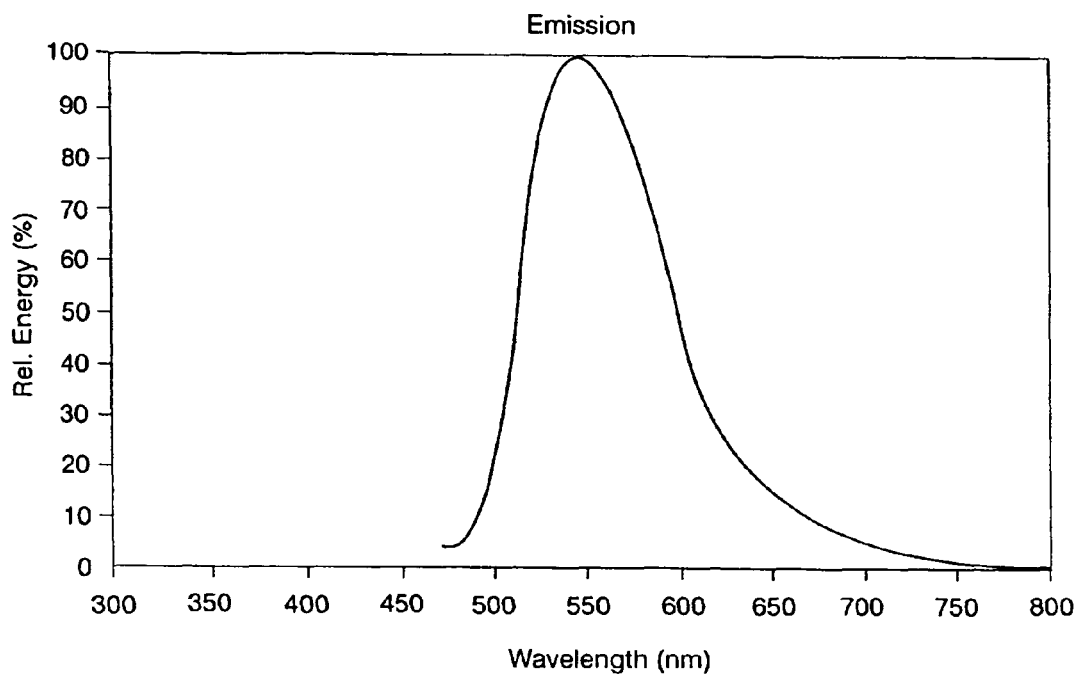
FIG. 1 shows an emission spectrum for an oxynitridosilicate.

FIG. 1 shows a specific example for the high-efficiency, green-emitting phosphor. This example relates to the emission of the phosphor $SrSi_2N_2O_2:(10\% Eu^{2+})$ in the HT modification, in which the Eu fraction forms 10 mol % of the lattice sites occupied by Sr. The emission maximum is at 545 nm, the mean dominant wavelength at 564 nm ($\lambda$dom). The color locus is x=0.393; y=0.577. The excitation takes place at 460 nm, and the FWHM is 84 nm.

Figure 2:
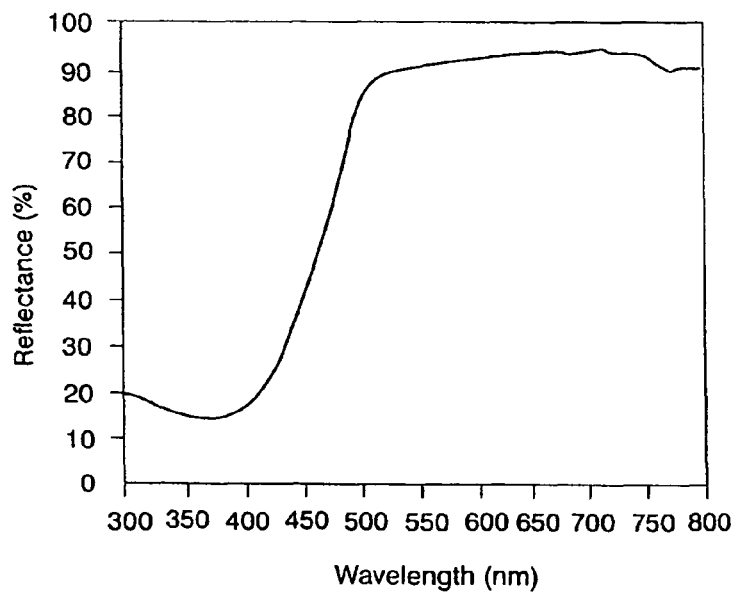
FIG. 2 shows the reflection spectrum of this oxynitridosilicate.

FIG. 2 shows the diffuse reflection spectrum for this phosphor. It reveals a pronounced minimum in the range below 430 nm, which therefore demonstrates the good excitability in this range.

Figure 3A:
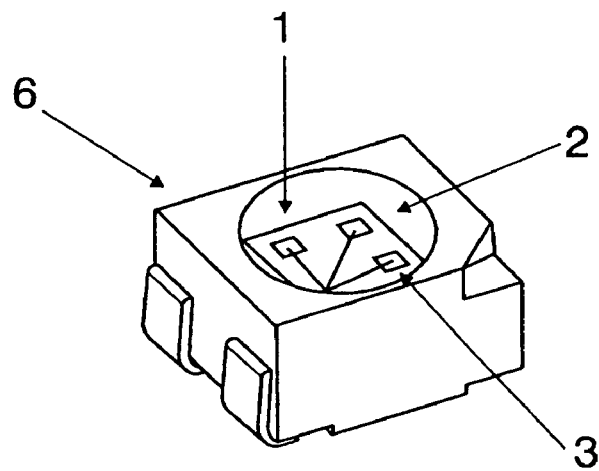
FIG. 3 shows an illumination system having a plurality of semiconductor components which serves as light source for white light (FIG. 3b), with a semiconductor component also being shown on a larger scale (FIG. 3a)
Figure 3B:
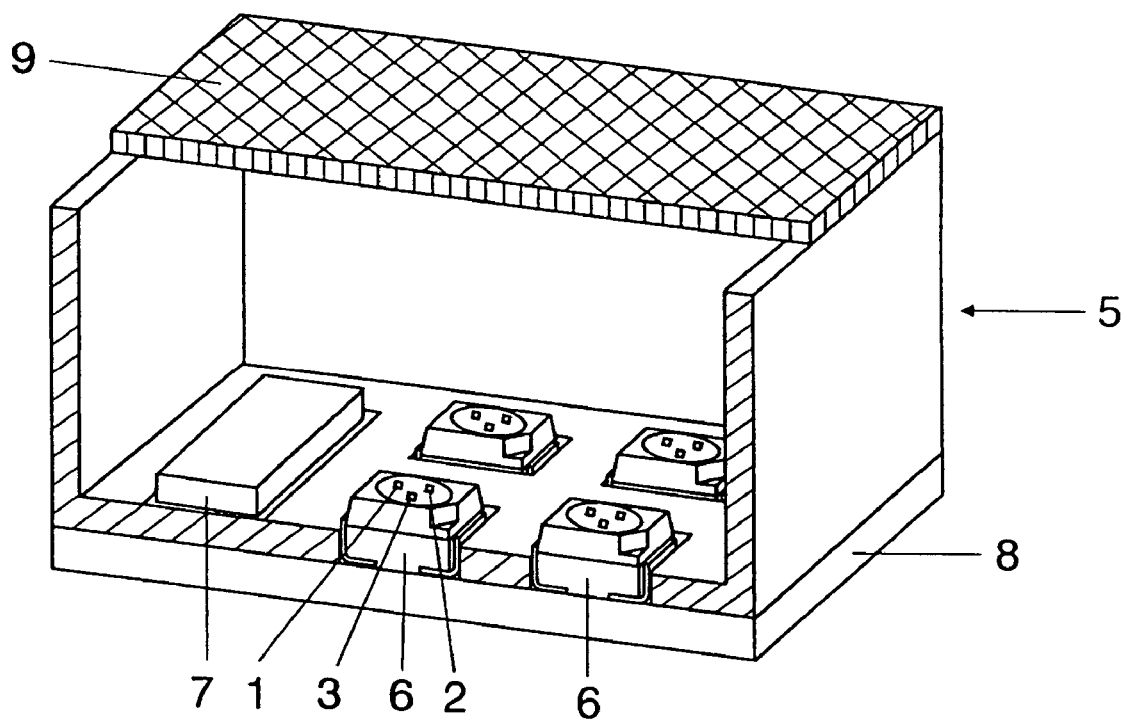

FIGS. 3a, 3b specifically illustrate the structure of a light source for white light. The light source, cf. FIG. 3b, is a semiconductor component 6 of the LED type having a first chip 1 of the InGaN type with a peak emission wavelength of, for example, 460 nm, and a second chip 2 of the InGaAlP type with a peak emission wavelength of, for example, 620 nm, and finally a semiconductor component of the luminescence conversion LED type with a third chip 3 of the InGaN type with a primary peak emission wavelength of, for example, 460 nm. The semiconductor component 6, together with other similar elements, is embedded in an opaque basic housing 8. The phosphor is the oxynitridosilicate $SrSi_2O_2N_2:Eu(10\%)$ proposed as the exemplary embodiment, which completely converts the primary radiation of the chip 3, transforming it into green radiation with a peak emission at 547 nm with $\lambda_{dom}$=563 nm. This solution has the major advantage of being tunable within a wide range of color temperatures by changing the relative intensities of the three LEDs by means of electronic control unit 7. A comparison, cf. Table 1, with the solution which has hitherto been available using three primary emitting LEDs (RGB, with green realized by an InGaN LED with $\lambda_{dom}$=526) convincingly demonstrates the superiority of the new solution. FIG. 3a shows a view of an LED 6 on a larger scale.

Figure 4:
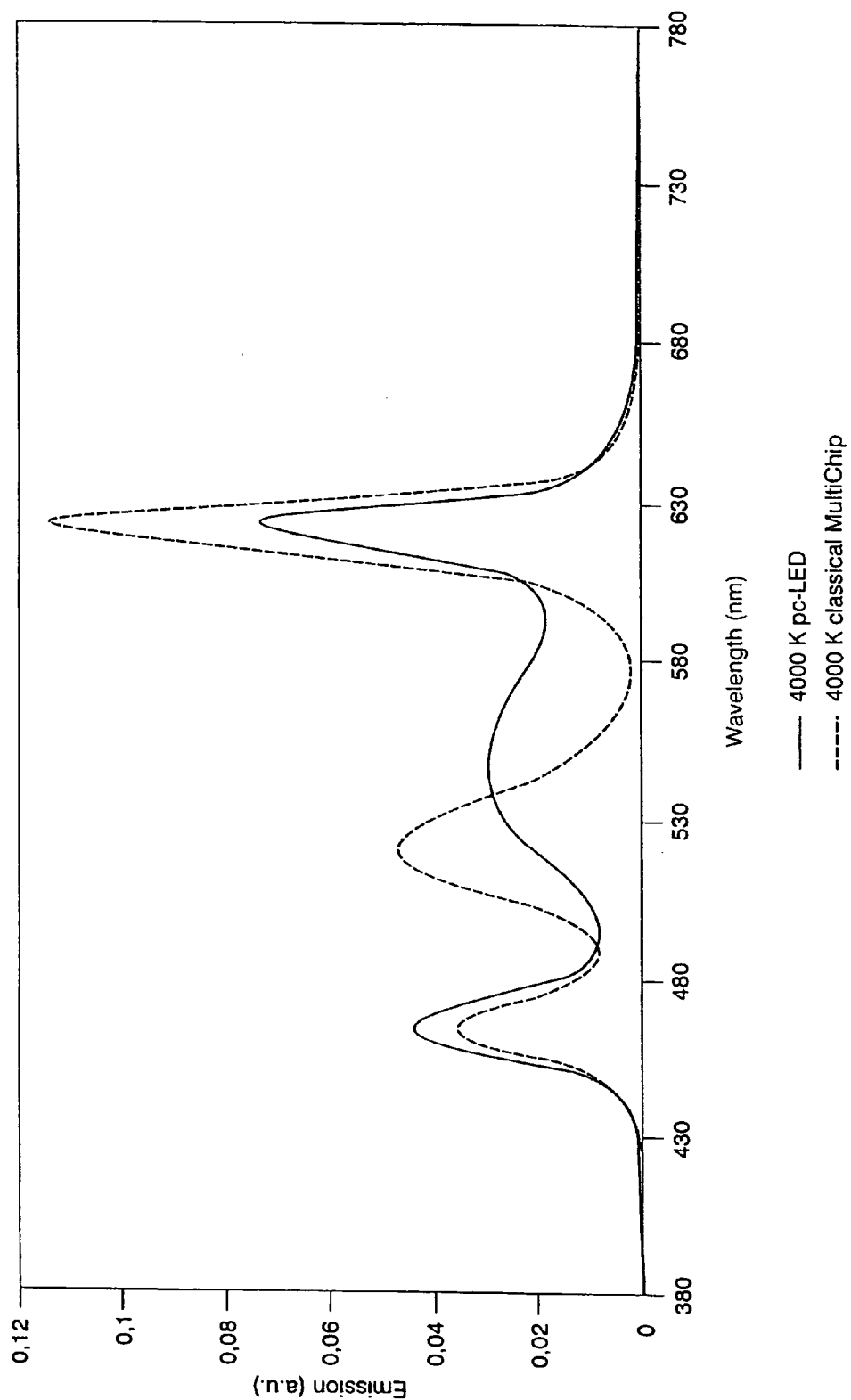
FIG. 4 shows an emission spectrum for the semiconductor component from FIG. 3.

FIG. 4 shows the emission from an illumination system of this type as spectral distribution (intensity in arbitrary units) against the wavelength (in nm). The dashed line shows the old solution (three primary emitting LEDs) compared to the new solution (two primary emitting LEDs and a luminescence conversion LED for green) for a color temperature of 4000 K.

The particular advantage of using a long-wave primary light source (450 to 465 nm) for the green luminescence conversion LED is that this avoids problems with ageing and degradation of the housing and resin or phosphor, with the result that a long service life is achieved.

In another exemplary embodiment, a UV-LED (approximately 380 nm) is used as primary light source for the green luminescence conversion LED; in this case, problems with ageing and degradation of housing and resin or phosphor have to be avoided as far as possible by means of additional measures which are known per se, such as careful selection of the housing material, addition of UV-resistant resin components. The major advantage of this solution is the very high efficiency of typically 30 lm/W which can thereby be achieved.

TABLE 1

Comparison of the color rendering index Ra and of the red index R9 between white-emitting semiconductor components based on the pure LED solution (old) and the solution using a green luminescence conversion LED (new)

| Color temperature (K) | Ra (old) | R9 (old) | Ra (new) | R9 (new) |
|---|---|---|---|---|
| 2700 | 38 | −23 | 91 | 92 |
| 3000 | 38 | −37 | 91 | 93 |
| 4000 | 43 | −71 | 94 | 89 |
| 5000 | 36 | −87 | 91 | 78 |
| 6430 | 51 | −99 | 86 | 57 |

Figure 5:
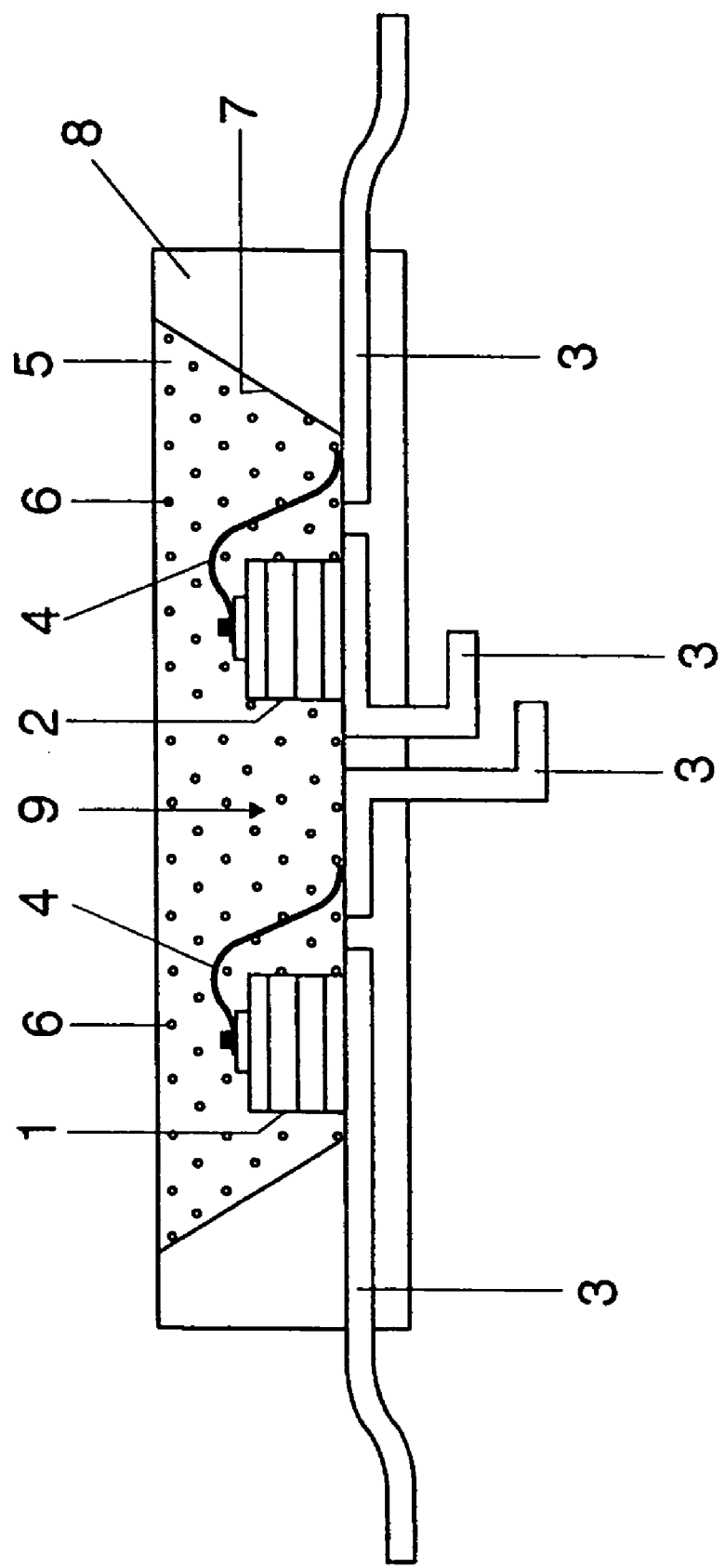
FIG. 5 shows a second exemplary embodiment of a semiconductor component.

In a further exemplary embodiment, cf. FIG. 5, a solution with two LEDs is used as white-emitting semiconductor component. The basic structure is similar to that described in WO 01/41215. A first luminescence conversion LED provides the blue and green components. A chip 1 of type InGaN with a primary peak emission wavelength of, for example, 460 nm is embedded in an opaque basic housing 8 in the region of a cavity 9. At the same time, a second LED 2 of type InGaAlP, which emits red light, similar to the first embodiment, is also accommodated in the cavity 9.

The chips have separately controllable, separate terminals 3. In each case one of the terminals 3 is connected to the chip 1, 2 via a bonding wire 4. The recess has an inclined wall 7 which serves as reflector for the primary radiation of the chips 1, 2. The recess 9 is filled with a potting compound 5, which as its main constituents typically contains a silicone casting resin (or alternatively epoxy casting resin) (80 to 90% by weight) and phosphor pigments 6 (less than 15% by weight). Further small fractions can be attributed, inter alia, to methyl ether and Aerosil. The phosphor is the oxynitridosilicate $SrSi_2O_2N_2$:Eu(10%) proposed as the first exemplary embodiment in a lower concentration, which only partially converts the primary radiation of the LED, transforming it into green radiation with a peak emission at 540 nm, or λdom=560 nm.

This narrow construction with a common cavity is possible since the red LED 2 with primary emission at 645 nm is not absorbed or converted by the green phosphor. This shows an example of the significance of a narrow full width at half maximum (FWHM below 90 nm, preferably below 80 nm). The only drawback of this extremely compact solution, which has been proposed for the first time here, compared to the three LED solution is the lack of tunability.

The illumination system is in particular also suitable for the concept of adaptive illumination, in which the luminous color or also the brightness of the illumination system can be set according to predetermined criteria which can be selected as desired or is suitably matched to the brightness of the surroundings.

The invention claimed is:

1. A high-efficiency LED-based illumination system with improved color rendering, simultaneously exploiting the color-mixing principle of blue, green and red (RGB mixing) and the principle of converting a primary radiation emitted by an LED into light with a longer wavelength by means of a phosphor which at least partially absorbs this radiation, at least two LEDs being used, of which a first LED emits primarily in the range from 340 nm to 470 nm (peak wavelength), and a second LED emits in the red region at 600 to 700 nm (peak wavelength), wherein the green component is produced by the primary radiation of the first LED being at least partially converted by a green-emitting phosphor, the green-emitting phosphor used being a phosphor from the class of the oxynitridosilicates, having a cation M and the empirical formula $M_{(1-c)}Si_2O_2N_2$:$D_c$, where M comprises at least 50 mol % of Sr as a constituent D represents an activator comprising Eu, c is within the range of 0.001 to 0.2, and the oxynitridosilicate completely or predominantly comprising the high-temperature-stable modification.

2. The illumination system as claimed in claim 1, wherein the system contains groups of LEDs of the same type.

3. The illumination system as claimed in claim 1, wherein three LEDs or groups of LEDs are used, the primary radiation of the first LED being completely converted into green secondary emission, with a third LED emitting blue light.

4. The illumination system as claimed in claim 1, wherein the system includes control electronics which impart dimmability or targeted controllability of properties of the system, such as the luminous color.

5. The illumination system as claimed in claim 3, wherein the system includes control electronics which control the brightness of the individual LEDs or groups of LEDs individually, so that a tunable illumination system is formed for a range of color temperatures which covers at least 1000 K within a band from 2500 to 5000 K, with an Ra of at least 85, for each selected color temperature within the selected range.

6. The illumination system as claimed in claim 1, wherein precisely two LEDs or groups of LEDs are used, the primary radiation of the first LED being only partially converted into green secondary emission, in which case both the green component and the blue component are emitted by the first LED.

7. The illumination system as claimed in claim 6, wherein the green secondary emission has a dominant wavelength in the range from 550 to 570 nm.

8. The illumination system as claimed in claim 1, wherein M further comprises at least one of Ba and Ca.

9. The illumination system as claimed in claim 1, wherein M further comprises at least one of Li, Zn, and Y.

10. The illumination system as claimed in claim 1, wherein the activator further comprises Mn.

11. The illumination system as claimed in claim 1, wherein the primary radiation source used is a light-emitting diode based on InGaN with a peak wavelength in the range from 420 to 470 nm.

12. The illumination system as claimed in claim 1, wherein the color mixing using the RGB principle realizes a white-emitting illumination system with a color temperature of from 2500 to 5000 K.

13. The illumination system as claimed in claim 1, wherein a plurality of light-emitting components are arranged in a cavity.

14. The illumination system as claimed in claim 1, wherein the full width at half maximum of the emission of the oxynitridosilicate is less than 90 nm.

15. The illumination system as claimed in claim 1, wherein the system includes electronics for actuating individual LEDs or groups of LEDs.

16. The illumination system as claimed in claim 1, wherein the first LED emits primarily in the range from 420 nm to 470 nm (peak wavelength).

17. The illumination system as claimed in claim 3, wherein the third LED emitting blue light with a peak wavelength in the range from 430 to 470 nm.

18. The illumination system as claimed in claim 5, wherein the Ra is at least 90.

19. The illumination system as claimed in claim 8, wherein M comprises up to 30 mol % of the at least one of Ba and Ca.

20. The illumination system as claimed in claim 9, wherein M comprises up to 30 mol % of the at least one of Li, La, Zn, Na, and Y.

21. The illumination system as claimed in claim 10, wherein D comprises up to 30 mol % Mn.

22. The illumination system as claimed in claim 11, wherein the light-emitting diode based on InGaN emits a peak wavelength in the range from 440 to 465 nm.

23. The illumination system as claimed in claim 12, wherein the color temperature is 3500 to 5000 K.

24. The illumination system as claimed in claim 1, wherein a plurality of light-emitting components are arranged in a cavity and comprise a luminescence conversion LED which imparts blue and green components of the emission simultaneously and an LED which imparts red components of the emission directly.

25. The illumination system as claimed in claim 14, wherein the full width at half maximum of the emission of the oxynitridosilicate is preferably less than 80 nm.

26. A high-efficiency LED-based illumination system with improved color rendering, simultaneously exploiting the color-mixing principle of blue, green and red (RGB mixing) and the principle of converting a primary radiation emitted by an LED into light with a longer wavelength by means of a phosphor which at least partially absorbs this radiation, at least two LEDs being used, of which a first LED emits primarily in the range from 340 nm to 470 nm (peak wavelength), and a second LED emits in the red region at 600 to 700 nm (peak wavelength), wherein the green component is produced by the primary radiation of the first LED being at least partially converted by a green-emitting phosphor, the green-emitting phosphor used being a phosphor from the class of the oxynitridosilicates, having a cation M and the empirical formula $M_{(1-c)}Si_2O_2N_2:D_c$, where M comprises at least 50 mol % of Sr as a constituent, D represents an activator comprising Eu, c is within the range of 0.001 to 0.2, the oxynitridosilicate completely or predominantly comprising high-temperature-stable modification, and a part of the group SiN in the oxynitridosilicate of formula $M_{(1-c)}Si_2O_2N_2:D_c$ is replaced by the group AlO.

27. The illumination system as claimed in claim 26, wherein up to 30 mol % of the group SiN in the oxynitridosilicate of formula $M_{(1-c)}Si_2O_2N_2:D_c$ is replaced by the group AlO.

* * * * *